US007999374B2

(12) United States Patent
So et al.

(10) Patent No.: US 7,999,374 B2
(45) Date of Patent: Aug. 16, 2011

(54) SEMICONDUCTOR COMPONENT HAVING ADHESIVE SQUEEZE-OUT PREVENTION CONFIGURATION AND METHOD OF MANUFACTURING THE SAME

(75) Inventors: Tsuyoshi So, Kawasaki (JP); Hideo Kubo, Kawasaki (JP); Seiji Ueno, Kawasaki (JP); Osamu Igawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/585,704

(22) Filed: Sep. 22, 2009

(65) Prior Publication Data

US 2010/0013089 A1 Jan. 21, 2010

Related U.S. Application Data

(63) Continuation of application No. PCT/JP2007/056389, filed on Mar. 27, 2007.

(51) Int. Cl.
*H01L 23/34* (2006.01)
*H01L 21/60* (2006.01)
*H01L 23/02* (2006.01)

(52) U.S. Cl. ........... 257/712; 257/E23.08; 257/E21.506; 257/704; 257/710; 257/667; 257/778; 257/737; 257/738; 257/680; 257/668; 257/717; 257/720; 257/713

(58) Field of Classification Search .................. 257/704, 257/710, 667, 738, 737, 778, 774, 680, 668, 257/646, 720, 712, 713, 717, E23.08, E21.506
See application file for complete search history.

(56) References Cited

U.S. PATENT DOCUMENTS 2,995,686 A * 8/1961 Selvin .......................... 361/736
5,424,918 A * 6/1995 Felps et al. .................... 361/704
5,959,353 A * 9/1999 Tomita .......................... 257/729
6,232,652 B1 * 5/2001 Matsushima ................ 257/667
7,173,329 B2 * 2/2007 Frutschy et al. .............. 257/698

FOREIGN PATENT DOCUMENTS

JP 5-251980 9/1993
JP 9-293808 11/1997

(Continued)

OTHER PUBLICATIONS

International Search Report for PCT/JP2007/056389, mailed Jun. 19, 2007.
English Translation of the International Preliminary Report on Patentability and Written Opinion, mailed Oct. 20, 2009 and issued in corresponding International Patent Application PCT/JP2007/056389.

*Primary Examiner* — Alexander O Williams
(74) *Attorney, Agent, or Firm* — Fujitsu Patent Center

(57) ABSTRACT

A semiconductor component includes a semiconductor element that has a plurality of signals, a wiring board that is disposed below the semiconductor element and that draws the plurality of signals of the semiconductor element, a heat conduction member that dissipates heat generated by the semiconductor element, a joining member that is disposed between the semiconductor element and the heat conduction member and that joins the heat conduction member to the semiconductor element, a support member formed with an opening so as to surround the semiconductor element that supports the heat conduction member, a first adhesive member that is disposed between the support member and the wiring board to bond the support member with the wiring board and a second adhesive member that is disposed between the support member and the heat conduction member to bond the support member with the heat conduction member.

9 Claims, 13 Drawing Sheets

FOREIGN PATENT DOCUMENTS

| | | |
|---|---|---|
| JP | 10-050877 | 2/1998 |
| JP | 10-144737 | 5/1998 |
| JP | 2000-106410 | 4/2000 |
| JP | 2003-218253 | 7/2003 |
| JP | 2004-296739 | 10/2004 |
| JP | 2006-80297 | 3/2006 |

* cited by examiner

SEMICONDUCTOR COMPONENT HAVING ADHESIVE SQUEEZE-OUT PREVENTION CONFIGURATION AND METHOD OF MANUFACTURING THE SAME

CROSS-REFERENCE TO RELATED APPLICATION

This is a continuation application of PCT/JP2007/56389, filed on Mar. 27, 2007.

FIELD

The embodiments discussed herein are related to a semiconductor component in which a semiconductor element is enclosed, and a manufacturing method of the semiconductor component.

BACKGROUND

Recently, in semiconductor packages in which a semiconductor element is enclosed, the heat generation rate has been increasing as the operation frequency and the wiring density of the semiconductor element increase and the density of wiring increases, and there is a need to securely dissipate the generated heat and to effectively reduce the thermal resistance. Moreover, as a semiconductor package which is superior in the convenience of additional installation, version upgrading, and maintenance etc. of electronic equipment after it is brought into operation, semiconductor packages of an LGA (Land Grid Array) structure in which thin plate-shaped electrodes are arranged in a grid-like pattern on the surface are widely used.

FIG. 1 is a sectional view of a conventional semiconductor package of an LGA structure.

The semiconductor package 10 includes a wiring board 11 in the lower face of which thin plate-shaped electrodes are disposed, a semiconductor element 12 to which I/O terminals 14 are attached, a heat spreader 17 which dissipates heat generated in the semiconductor element 12, a spacer 16 which supports the heat spreader 17, where the semiconductor element 12 and the heat spreader 17 are joined by a joining member 13, and the spacer 16, the wiring board 11, and the heat spreader 17 are bonded by an adhesive 15. In order to reduce the thermal resistivity of the semiconductor element 12, it is necessary to effectively transfer heat generated at the semiconductor element 12 to the heat spreader 17, and therefore the thickness of the joining member 13 for joining the semiconductor element 12 with the heat spreader 17 is precisely adjusted.

The semiconductor package 10, in which the wiring board 11 is displaced so as to face a socket with pins arranged in a grid-like pattern, is mounted into electronic equipment by being strongly pressed against the socket. Thus, a semiconductor package 10 of LGA structure has an advantage in that it may be attached to and detached from electronic equipment more easily and may be powered more efficiently compared with semiconductor packages including raised electrodes made up of pins and solder etc.

Incidentally, in a semiconductor package 10 of LGA structure, the registration with the socket is performed by the outer dimensions, and the semiconductor package 10 is mounted into electronic equipment by being strongly pressed against the socket. For this reason, if the wiring board 11, the heat spreader 17, and others are obliquely bonded due to the squeeze-out of the adhesive 15 or any other factor, the pressing force F from the socket will be applied leaning toward one part of the surface of the wiring board 11 posing risks of such as fracture of the wiring board 11 and breakage of the internal wiring. Further, if the adhesive 15 is squeezed out beyond the outer dimension of the semiconductor package 10, misregistrations between the semiconductor package 10 and the socket may take place resulting in connection deficiencies.

In this respect, Japanese Laid-open Patent Publications No. 2006-80297 and No. 2004-296739 describe a technique in which there is provided a step in the end face of the spacer so that the squeezed-out adhesive is accommodated therein. According to the technique described by Japanese Laid-open Patent Publications No. 2006-80297 and No. 2004-296739, since an excess adhesive will be pressed out to the end face of the spacer entering into the step, it is possible to mitigate the squeeze-out of the adhesive.

However, since the semiconductor package 10 itself is small-sized, a problem remains in that the amount of adhesive which may be accommodated in the step in the spacer end face is very small and is not enough to solve the fracture of the wiring board and the connection deficiencies due to the squeeze-out of the adhesive.

SUMMARY

According to an aspect of the invention, a semiconductor component includes a semiconductor element that has a plurality of signals, a wiring board that is disposed below the semiconductor element and that draws the plurality of signals of the semiconductor element, a heat conduction member that dissipates heat generated by the semiconductor element, a joining member that is disposed between the semiconductor element and the heat conduction member and that joins the heat conduction member to the semiconductor element, a support member formed with an opening so as to surround the semiconductor element that supports the heat conduction member, a first adhesive member that is disposed between the support member and the wiring board to bond the support member with the wiring board and a second adhesive member that is disposed between the support member and the heat conduction member to bond the support member with the heat conduction member.

DESCRIPTION OF EMBODIMENTS

Hereafter, embodiments of the present invention will be described with reference to appended drawings.

FIG. 2 is a schematic block diagram of a semiconductor component which is an embodiment of the present invention.

Figure 1:
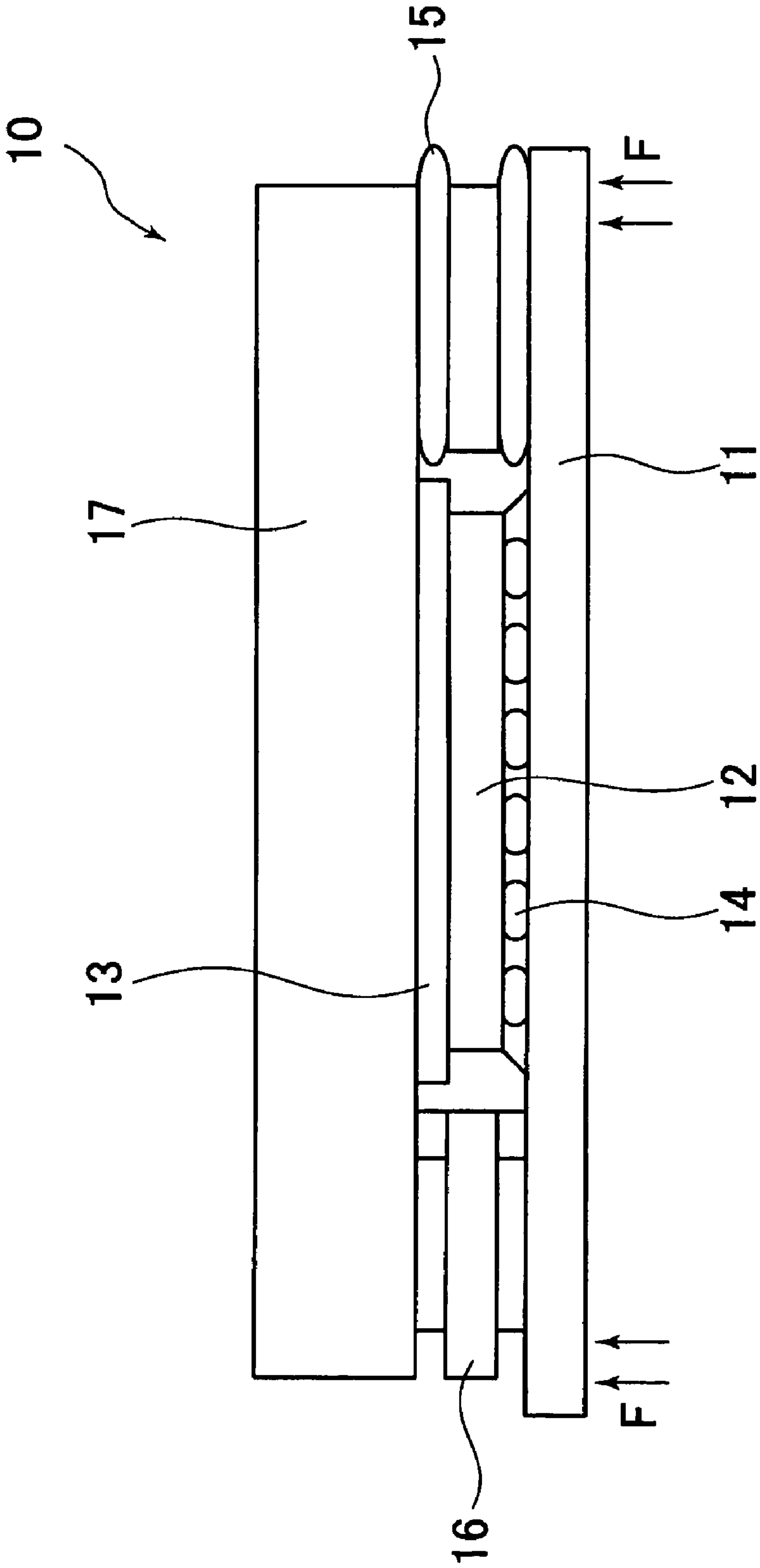
FIG. 1 is a sectional view of a conventional semiconductor package of an LGA structure.
Figure 2B:
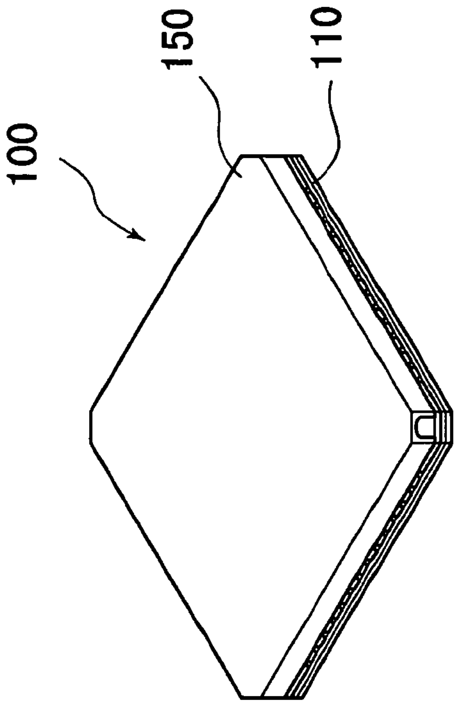
FIG. 2B illustrates an outer perspective view of the semiconductor component.
Figure 2A:
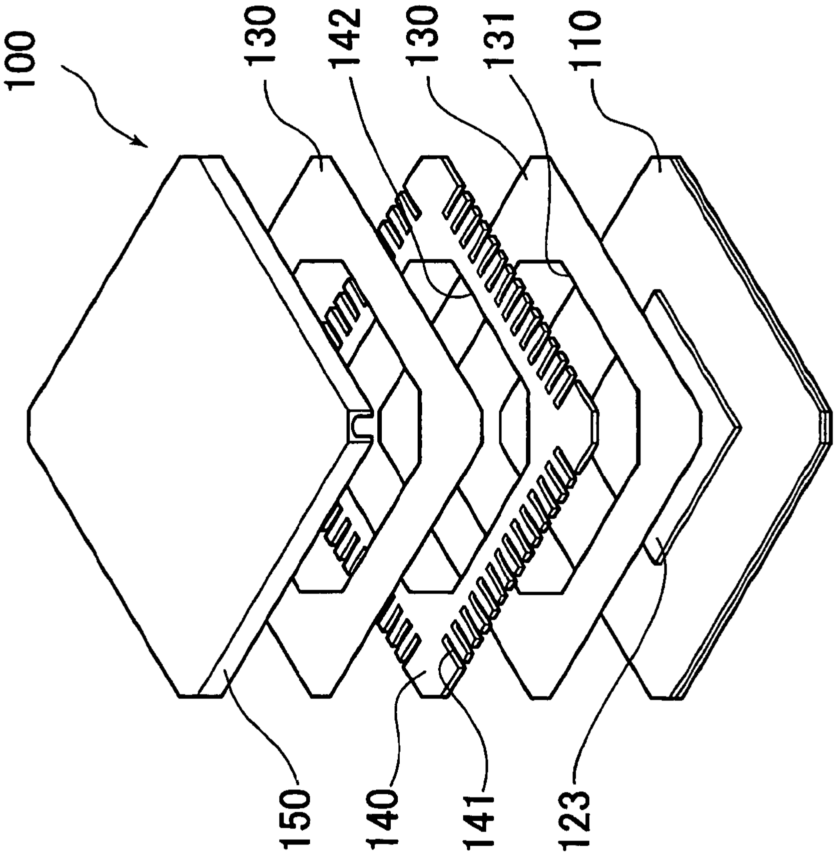
FIG. 2A is an exploded perspective view to illustrate a semiconductor component.

FIG. 2A is an exploded perspective view to illustrate a semiconductor component 100.

The semiconductor component 100 is formed such that on a wiring board 110, there are placed a joining member 123, an adhesive sheet 130, a spacer 140, and a heat spreader 150 etc. on top of one another.

There are thin plate-shaped electrodes disposed in the lower face of the wiring board 110, which exchanges signals and power with external apparatuses as the result of those electrodes being pressed against a socket. The wiring board 110 corresponds to an example of the wiring board referred to in the present embodiment.

There is disposed a semiconductor element beneath the joining member 123, and the semiconductor element and the heat spreader 150 are bonded by the joining member 123. The semiconductor element and the joining member 123 will be illustrated below. Moreover, the adhesive sheet 130 and the spacer 140 are provided with openings 131 and 142 respectively, and the semiconductor element and the joining member 123 are disposed inside those openings 131 and 142.

The adhesive sheet 130 is made up of a thermosetting adhesive material and two sheets thereof are provided interposing the spacer 140 therebetween. The adhesive sheet 130 disposed between the wiring board 110 and the spacer 140 is an example of the first adhesive member referred to in the present embodiment and also corresponds to an example of the first thermosetting adhesive member referred to in the present embodiment. Further, the adhesive sheet 130 disposed between the spacer 140 and the heat spreader 150 is an example of the second adhesive member referred to in the present embodiment and also corresponds to an example of the second thermosetting adhesive member referred to in the present embodiment.

FIG. 3 illustrates the spacer 140.

Figure 3B:
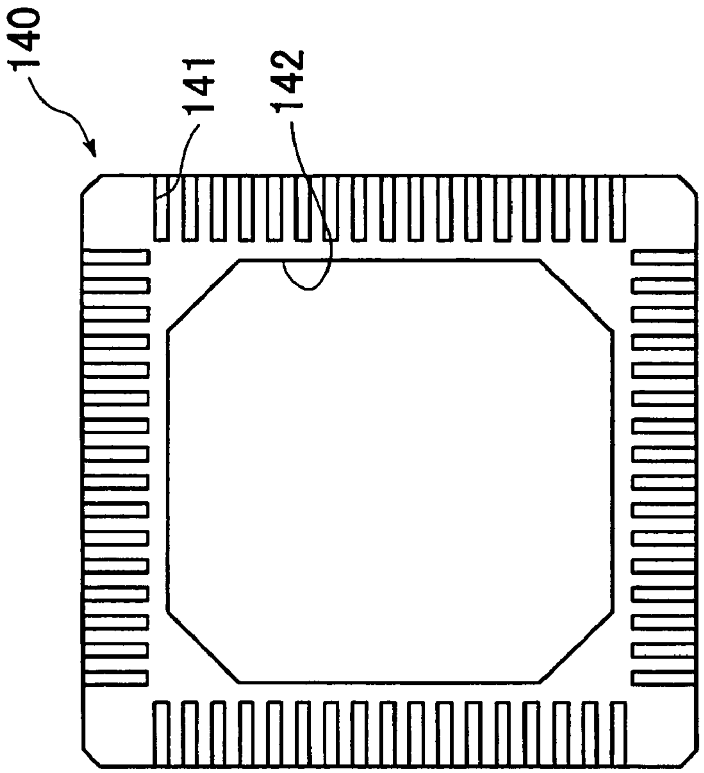
FIG. 3B illustrates a lower face of the spacer on a side facing the wiring board.
Figure 3A:
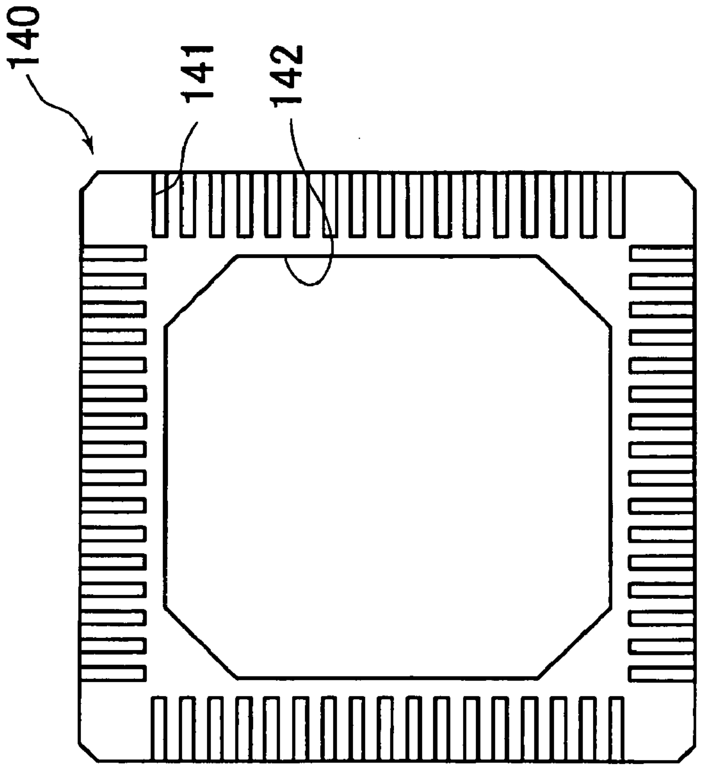
FIG. 3A illustrates an upper face of a spacer on a side facing a heat spreader.

FIG. 3A illustrates the face (hereafter, referred to as an upper face) of the spacer 140 on the side facing the heat spreader 150, and FIG. 3B illustrates the face (hereafter, referred to as a lower face) of the spacer 140 on the side facing the wiring board 110.

The spacer 140, which is adapted to support the heat spreader 150, is formed with grooves 141 having the same length with one another in the outer peripheral section of each of the upper and lower faces as illustrated in FIG. 3. The spacer 140 is an example of the support member referred to in the present embodiment, and the grooves 141 are an example of "the depressions" referred to in the present embodiment, and also correspond to an example of "the grooves" referred to in the present embodiment.

Now, description will return to FIG. 2.

The heat spreader 150 is adapted to dissipate heat generated by the semiconductor element disposed beneath the joining member 123. The heat spreader 150 corresponds to an example of the heat conduction member referred to in the present embodiment.

FIG. 2B illustrates an outer perspective view of the semiconductor component 100.

The heat spreader 150 is formed, from outward appearances, such that a spacer 140 etc. is interposed between the wiring board 110 and the heat spreader 150 and, in the space formed by the wiring board 110, the heat spreader 150, and spacer 140, the semiconductor element and the joining member 123 are enclosed.

Next, a manufacturing method of the semiconductor component 100 will be described.

Figure 4:
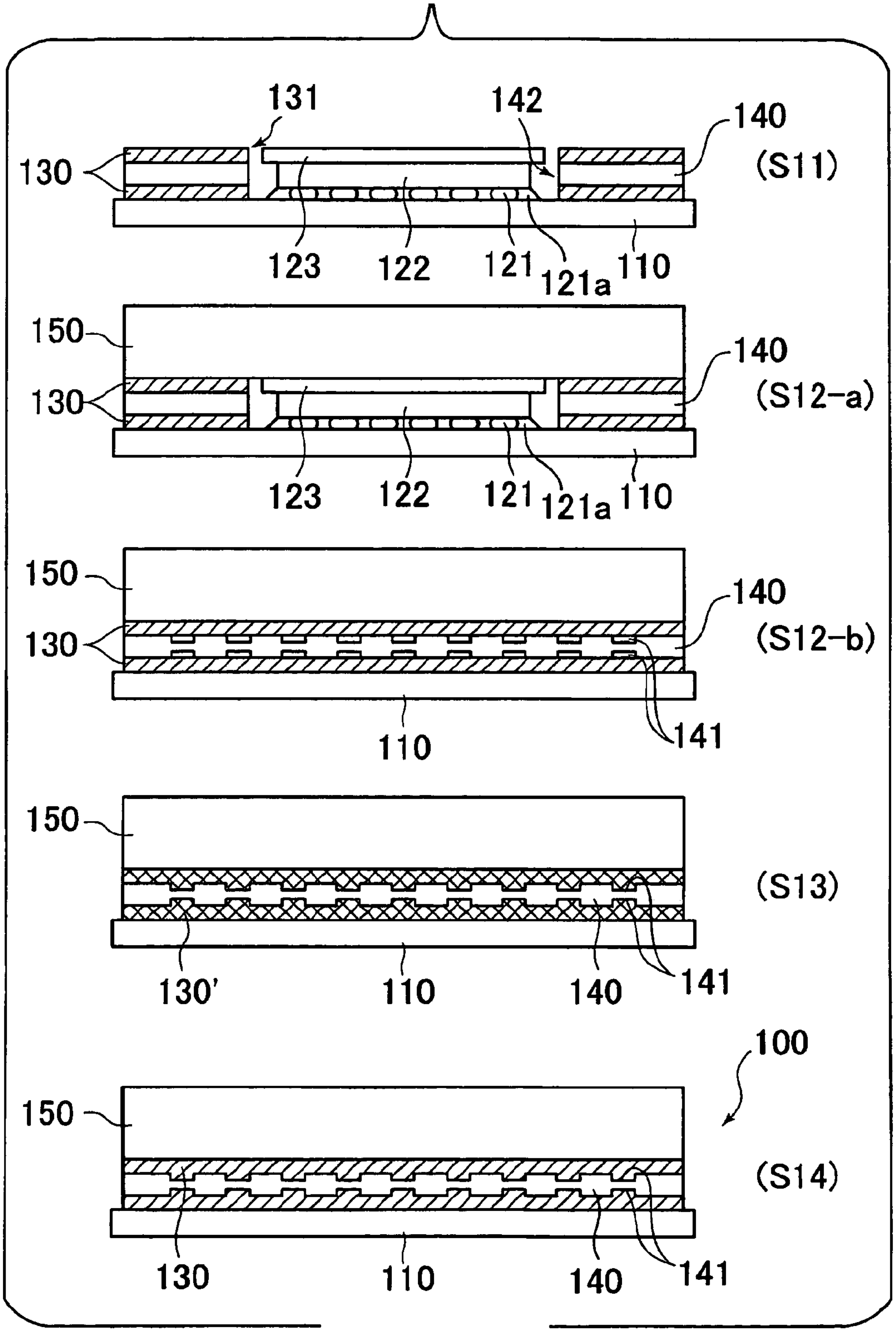
FIG. 4 illustrates a manufacturing method of a semiconductor component.

FIG. 4 illustrates a manufacturing method of the semiconductor component 100.

Upon manufacturing the semiconductor component 100, first, a first adhesive sheet 130, a spacer 140, and a second adhesive sheet 130 are disposed in this order on a wiring board 110, and a semiconductor element 122, to which an I/O terminal 121 is bonded by a adhesive material 121*a*, and a joining member 123 are successively disposed inside each of the openings 131 and 142 of the adhesive sheet 130 and the spacer 140 (step S11 of FIG. 4). The semiconductor element 122 is an example of the semiconductor element referred to in the present embodiment, and the joining member 123 corresponds to an example of the joining member referred to in the present embodiment. Moreover, the process of disposing the adhesive sheet 130 and the spacer 140 illustrated in step S11 of FIG. 4 corresponds to an example of "the step of disposing a first thermosetting adhesive member, a support member, and a second thermosetting adhesive member on top of one another" in the manufacturing method of the semiconductor component of the present embodiment.

It is noted that in the present embodiment, an adhesive sheet 130 having a thickness larger than conventionally used is applied so that the thickness of the two adhesive sheets 130 interposing the spacer 140 therebetween is larger than the thickness of the semiconductor element 122 with the joining member 123 placed thereon.

Then, a heat spreader 150 is overlaid on the joining member 123 and the adhesive sheet 130 to form a semiconductor component 100 in the state before various elements are bonded thereto (hereafter, the semiconductor component 100 before the bonding process is referred to as an "unbonded semiconductor component 100'"). In step S12_*a* of FIG. 4, a section taken across near the center of unbonded semiconductor component 100' is illustrated and, in step S12_*b* of FIG. 4, a section view taken across the outer peripheral section of the unbonded semiconductor component 100' is illustrated. As illustrated in step S12_*b*, the grooves 141 are formed in the upper and lower faces of the spacer 140, and at this time, the adhesive sheet 130 has not gotten into the inside of those grooves 141. This step S12 of overlaying the heat spreader 150 corresponds to one example of "the step of disposing the heat conduction member" in the manufacturing method of the semiconductor component of the present embodiment.

When the heat spreader 150 is overlaid and the unbonded semiconductor component 100' is heated, the surface of the joining member 123 melts thereby increasing the viscosity, and two adhesive sheets 130 melt into a liquid. Further, the heat spreader 150 is pressed against the joining member 123 (step S13 of FIG. 4). In the present embodiment, an adhesive sheet 130 of a thickness larger than conventionally used is used, and as a result of the heat spreader 150 being pushed in up to the height of the upper face of the joining member 123, the thermosetting adhesive material 132, which has resulted from the melting of the two adhesive sheets 130, is pushed out into the grooves 141 formed in the upper and lower faces of the spacer 140. Step S13 of pushing out the thermosetting adhesive material 132 into the grooves 141 corresponds to an example of "the step of filling the grooves with the thermosetting adhesive member" in the manufacturing method of the semiconductor component of the present embodiment.

Next, the unbonded semiconductor component 100' is cooled down (step S14 of FIG. 4). As a result, the joining member 123 and the thermosetting adhesive material 132 are hardened, thereby the joining member 123 being bonded to the heat spreader 150, and the spacer 140 being bonded to the heat spreader 150 and the wiring board 110. This step S14 of hardening the thermosetting adhesive material 132 corresponds to an example of "the step of hardening the thermosetting adhesive member" in the manufacturing method of the semiconductor component of the present embodiment.

The hardened thermosetting adhesive material 132' is present between the spacer 140 and the heat spreader 150 and between the spacer 140 and the wiring board 110 thereby bonding them, and an excess part thereof has gotten into the grooves 141 of the spacer 140. Thus, since the semiconductor component 100, in which no squeeze-out of the thermosetting adhesive material 132 has occurred, has a uniform thickness, it is possible to avoid deficiencies such as that the wiring board 110 fractures by being pressed hard against the socket, and misregistration with the socket, which is registered by the outer dimension, takes place leading to connection deficiencies. Further, since as a result of a rather thick adhesive sheet 130 being used, the clearances between the spacer 140 and the wiring board 110, and between the spacer and the heat spreader 150 are filled with an excess thermosetting adhesive material 132, it becomes possible to omit the process of charging and hardening liquid resin such as underfill materials into clearances, which is conventionally carried out in a later stage of step S14, thus reducing the manufacturing cost.

So far, the description of the first embodiment of the present invention has been completed, and a second embodiment thereof will be described. Since the second embodiment of the present invention has a similar structure as the first embodiment excepting the shape of the grooves formed in the spacer, like elements as those of the first embodiment will be given like reference symbols to omit the description thereof and only the differences from the first embodiment will be described.

Figure 5:
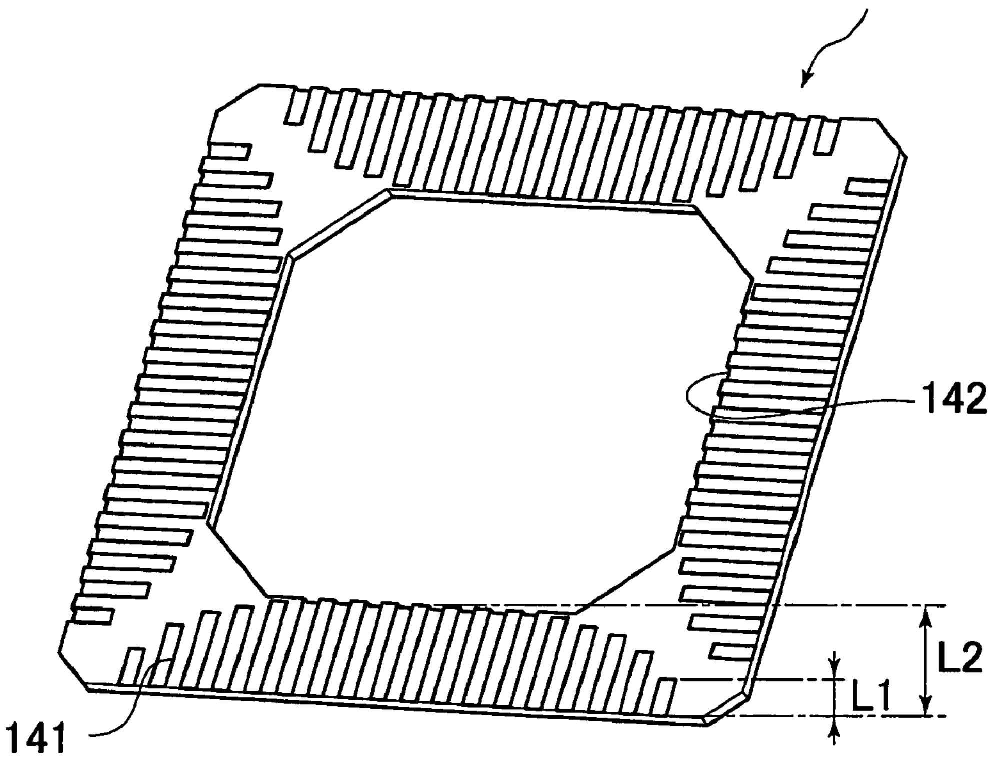
FIG. 5 illustrates a spacer in a second embodiment of the present invention.

FIG. 5 illustrates a spacer 140_2 in the second embodiment of the present invention.

The spacer 140_2 of the present embodiment is formed, unlike the spacer 140 of the first embodiment illustrated in FIG. 2, such that the length L1 of the groove in a corner portion is less than the length L2 of the groove 141 in a middle side portion. Even if the spacer 140_2 is bonded to the heat spreader 150 and the wiring board 110 illustrated in FIG. 2, the corner portions of the spacer 140_2 are susceptible to peeling off. According to the spacer 140_2 of the present embodiment, the length of the groove 141 is reduced as closer to a corner portion so that the contact area with the adhesive sheet 130 becomes larger, and thereby it is made possible to securely bond the corner portions to the heat spreader 150 and the wiring board 110.

So far, the description of the second embodiment of the present invention has been completed, and a third embodiment thereof will be described. Since the third embodiment of the present invention has a similar structure as the first embodiment excepting the shape of the grooves provided in the spacer, like elements as those of the first embodiment will be given like reference symbols to omit the description thereof and only the differences from the first embodiment will be described.

Figure 6:
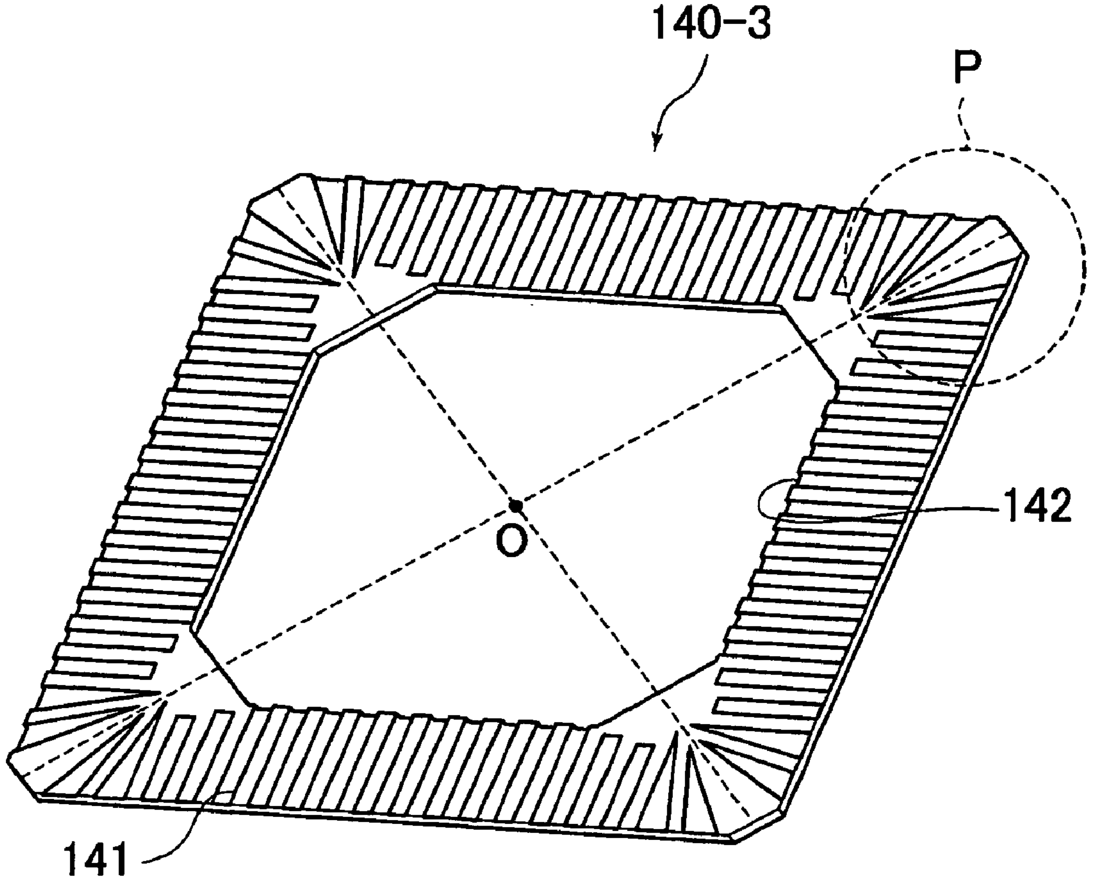
FIG. 6 illustrates a spacer in a third embodiment of the present invention.

FIG. 6 illustrates a spacer 140_3 of the third embodiment of the present invention.

The spacer 140_3 of the present embodiment is formed such that the grooves 141 in a corner portion P are radially provided at an angle with one another so as to intersect at the inside of the opening 142. In the spacer 140_3 illustrated in FIG. 6, the corner portion P, which is susceptible to peeling off even when bonded, is formed such that the spacing between grooves 141 becomes larger as closer to the outer peripheral side, and the contact area with the adhesive sheet 130 becomes larger. Thus, by providing radial grooves 141 in the corner portions P of the spacer 140_3, it is also possible to prevent the squeeze-out of the thermosetting adhesive material while maintain the bonding accuracy of the spacer 140_3.

So far, the description of the third embodiment of the present invention has been completed, and a fourth embodiment thereof will be described. Since the third embodiment of the present invention also has a similar structure as the first embodiment excepting that cut-outs instead of the grooves are provided in the spacer, like elements as those of the first embodiment will be given like reference symbols to omit the description thereof and only the differences from the first embodiment will be described.

Figure 7:
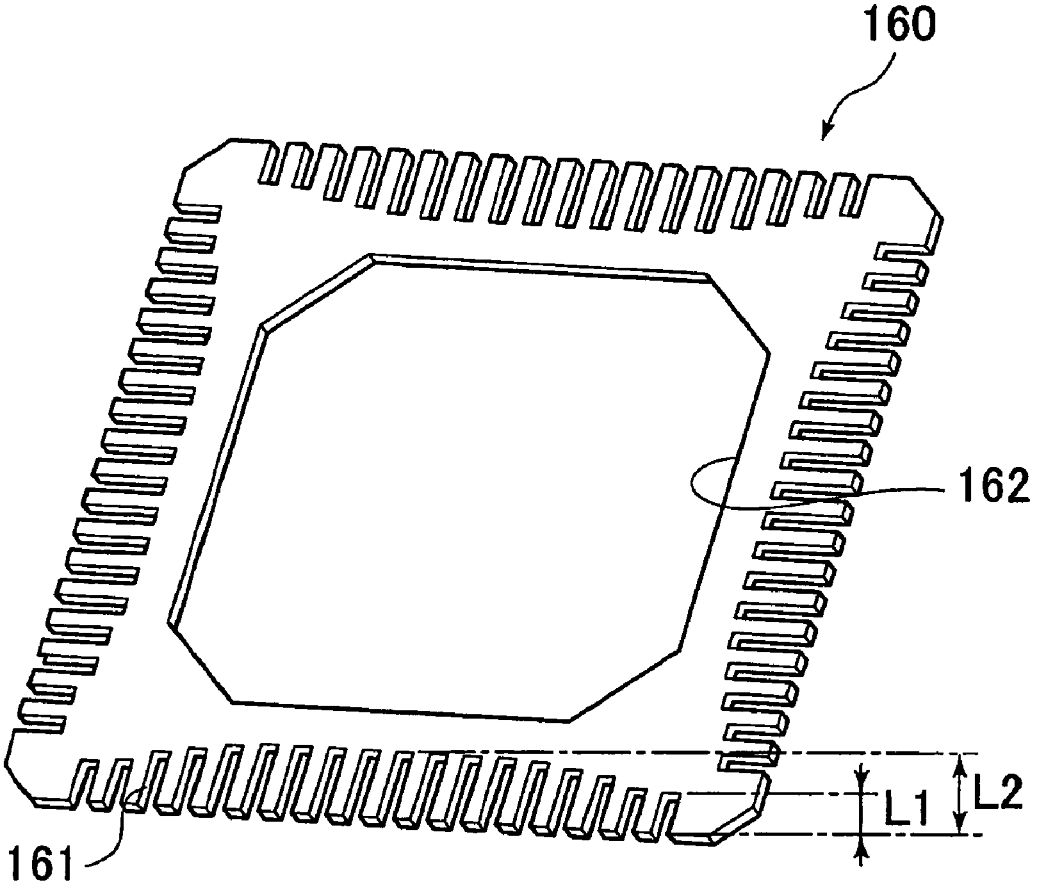
FIG. 7 illustrates a spacer in a fourth embodiment of the present invention.

FIG. 7 illustrates a spacer 160 in the fourth embodiment of the present invention.

The spacer 160 of the present embodiment is, unlike the spacer 140 of the first embodiment illustrated in FIG. 2, formed with cut-outs 161 instead of the grooves 141 in the outer peripheral section. Moreover, the spacer 160 of the present embodiment is formed such that the length L1 of the cut-out 161 in a corner portion is less than the length L2 of the cut-out 161 in a middle side portion, intending to maintain the bonding accuracy of the spacer 160.

Figure 8:
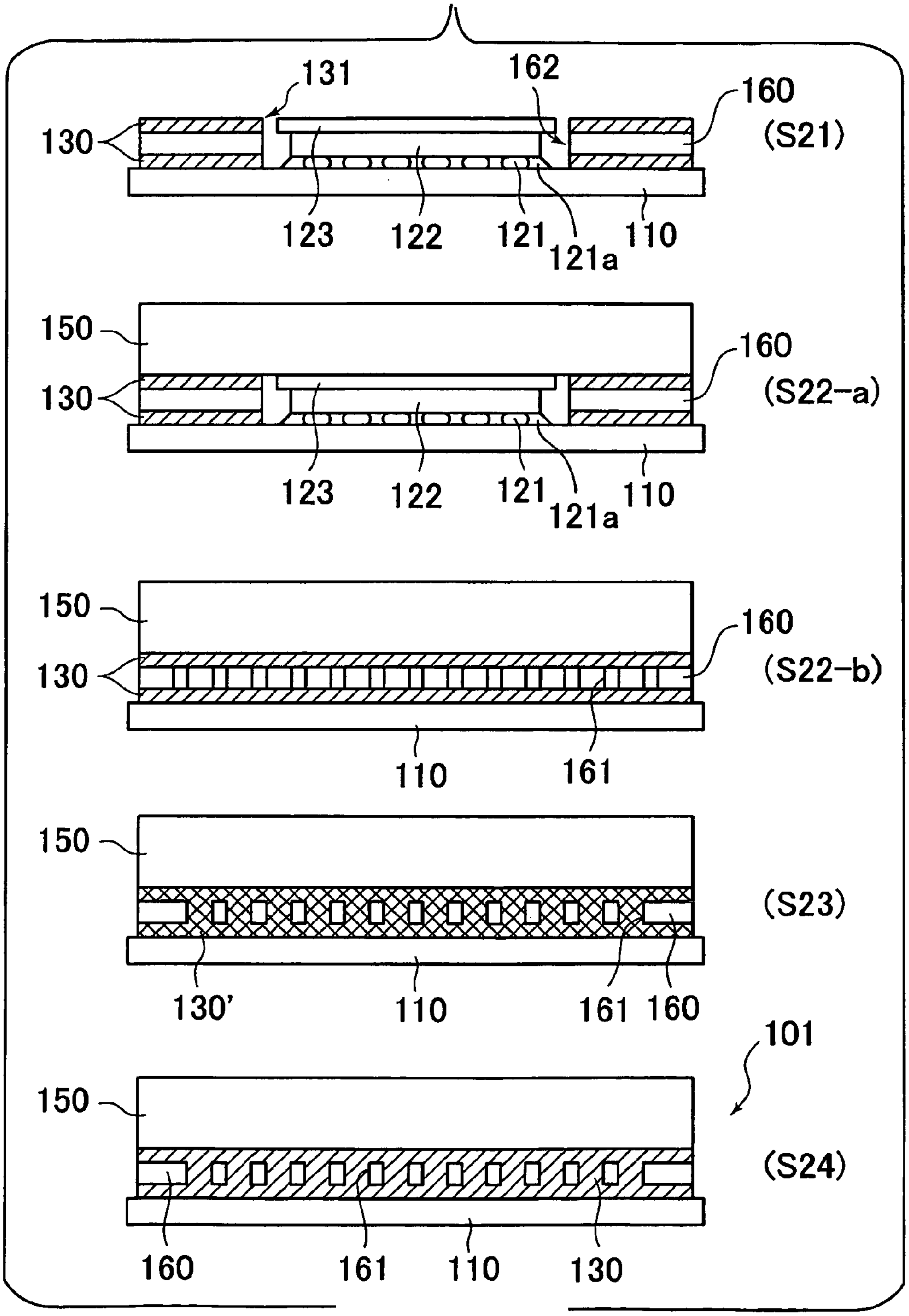
FIG. 8 illustrates a manufacturing method of a semiconductor component to which the spacer illustrated in FIG. 7 is applied.

FIG. 8 illustrates a manufacturing method of a semiconductor component 101 to which the spacer illustrated in FIG. 7 is applied.

Similarly to the manufacturing method of the semiconductor component 101 of the first embodiment illustrated in FIG. 4, the present embodiment also has a structure such that on the wiring board 110, there are disposed a first adhesive sheet 130, a spacer 160, and a second adhesive sheet 130 in this order, and the semiconductor element 122 provided with the I/O terminals 121, and the joining member 123 are successively disposed inside the respective openings 131 and 162 of the adhesive sheet 130 and the spacer 160 (step S21 of FIG. 8).

Next, the heat spreader 150 is overlaid to form an unbonded semiconductor component 101'. In step S22_*a* of FIG. 8, a section taken across near the center of the unbonded semiconductor component 101' is illustrated, and in step S22_*b* of FIG. 8, a sectional view taken across the peripheral portion of the unbonded semiconductor component 101' is illustrated. In the present embodiment, cut-outs 161 are provided in the spacer 160 as illustrated in step S22_*b*.

Further, the unbonded semiconductor component 101' is heated to melt the joining member 123 and the two adhesive sheets 130 (step S23 of FIG. 8). As a result, the thermosetting adhesive material 132 resulting from the melting of the two adhesive sheets 130 is pushed out and filled into the cut-outs 161 of the spacer 160. Step S23 of pushing out the thermosetting adhesive material 132 into the cut-outs 161 corresponds to an example of "the step of filling the cut-outs with the thermosetting adhesive member" in the manufacturing method of the semiconductor component of the present embodiment.

When the cut-outs 161 are filled with the thermosetting adhesive material 132, the unbonded semiconductor component 100' is cooled down (step S24 of FIG. 8). In the present embodiment, an excess part of the hardened thermosetting adhesive material 132', which has not been used for bonding the spacer 160 with the heat spreader 150 and the wiring board 110, has gotten into the cut-outs 161 of the spacer 160. Thus, by providing the cut-outs 161 instead of grooves in the spacer 160, it is possible to more efficiently accommodate the excess thermosetting adhesive material 132'.

So far, the description of the fourth embodiment of the present invention has been completed, and a fifth embodiment thereof will be described. Since the fifth embodiment of the present invention has a similar structure as the fourth embodiment of the present invention excepting the shape of the cut-outs provided in the spacer, like elements as those of the fourth embodiment will be given like reference symbols to omit the description thereof and only the differences from the fourth embodiment will be described.

Figure 9:
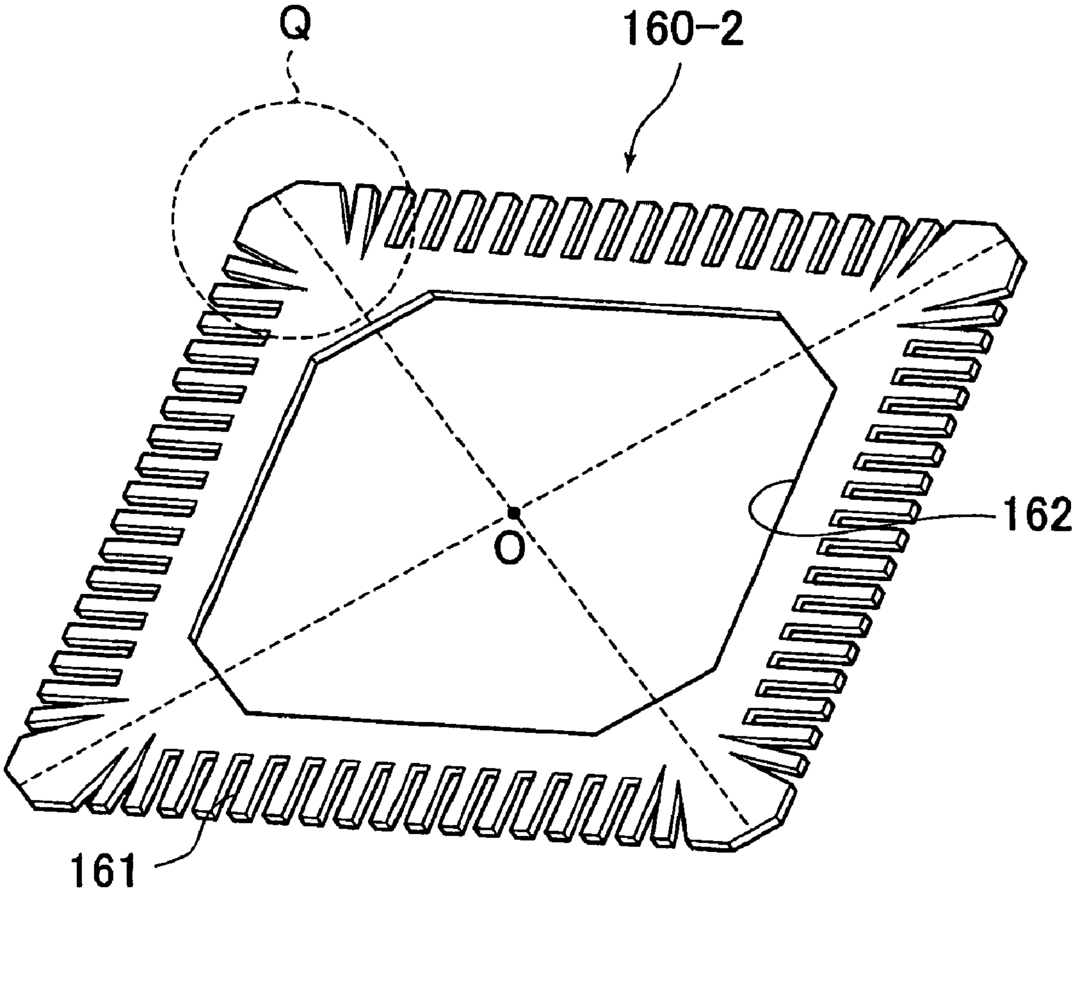
FIG. 9 illustrates a spacer in a fifth embodiment of the present invention.

FIG. 9 illustrates a spacer 160_2 in the fifth embodiment of the present invention.

The spacer 160_2 of the present embodiment is formed such that cut-outs 161 in a corner portion P are radially provided at an angle with one another so as to intersect at within the opening 162. Since in the spacer 160 of the present embodiment, the contact area with the adhesive sheet 130 is larger in the corner portions P than in other portions, it is possible to achieve both the maintenance of the bonding accuracy and the prevention of the squeeze-out of the thermosetting adhesive material.

So far, the description of the fifth embodiment of the present invention has been completed, and a sixth embodiment thereof will be described. Since the sixth embodiment of the present invention has a similar structure as the first embodiment of the present invention excepting the shapes of the spacer and the adhesive sheet, like elements as those of the first embodiment will be given like reference symbols to omit the description thereof and only the differences from the first embodiment will be described.

Figure 10:
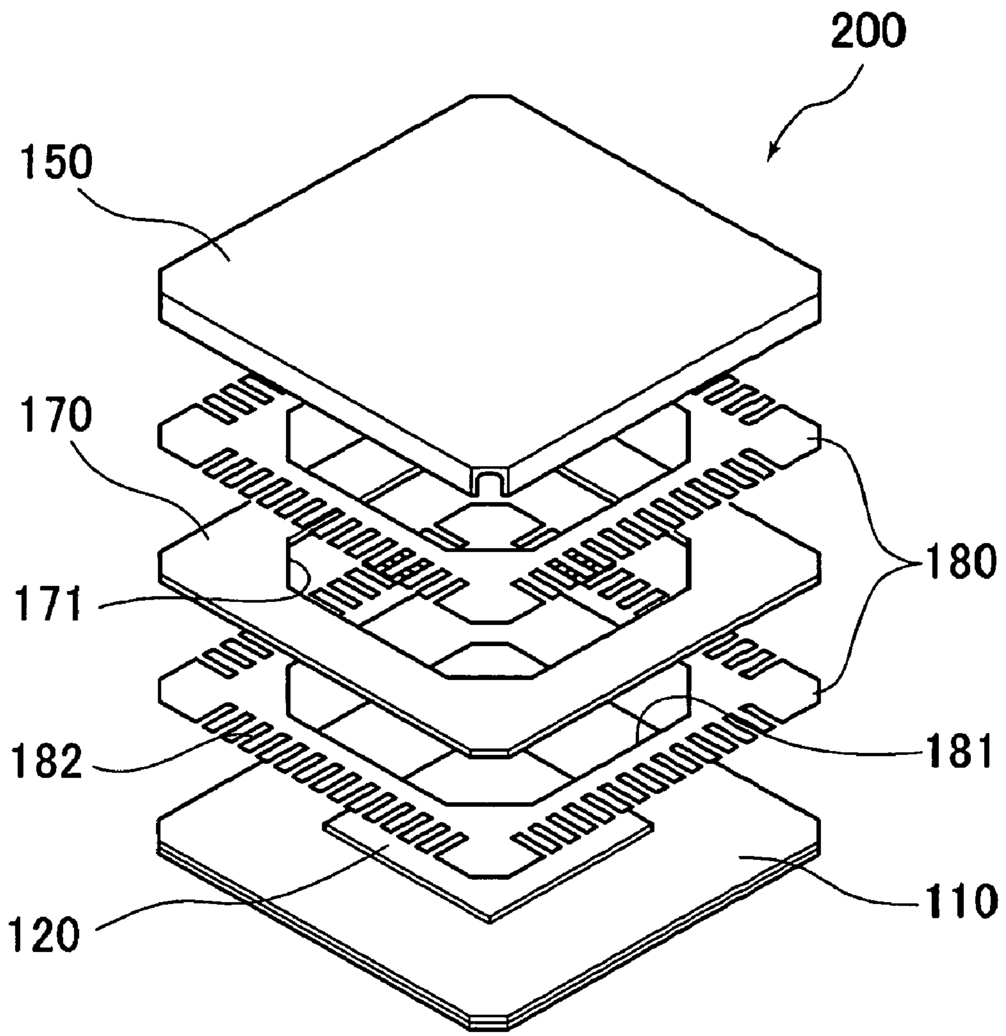
FIG. 10 is an exploded perspective view of a semiconductor component which is a sixth embodiment of the present invention.

FIG. 10 is an exploded perspective view of a semiconductor component 200 which is the sixth embodiment of the present invention.

Similarly to the semiconductor component 100 of the first embodiment illustrated in FIG. 2, the semiconductor component 200 of the present embodiment is formed such that on the wiring board 110, there are placed two adhesive sheets 180, a spacer 170, and a heat spreader 150 on top of one another, and a semiconductor section 129 is disposed inside the respective openings 181 and 171 provided in the adhesive sheet 180 and the spacer 170. Moreover, unlike the semiconductor component 100 of the first embodiment, neither groove nor cut-out is provided in the spacer 170 and instead, cut-outs 182 are formed in the respective outer peripheral sections of the two adhesive sheets 180.

When the adhesive sheet 180 illustrated in FIG. 10 is melted, an excess thermosetting adhesive material may spread over the portions of the cut-outs 182 of the adhesive sheet 180. As a result of this, it is possible to securely bond the spacer 170 and to avoid the deficiency that the thermosetting adhesive member is squeezed out to the outer face of the semiconductor component 200.

So far, the description of the sixth embodiment of the present invention has been completed, and a seventh embodiment thereof will be described. Since the seventh embodiment of the present invention has a similar structure as the sixth embodiment of the present invention excepting the shape of the cut-out of the adhesive sheet, only the differences from the sixth embodiment will be described.

Figure 11:
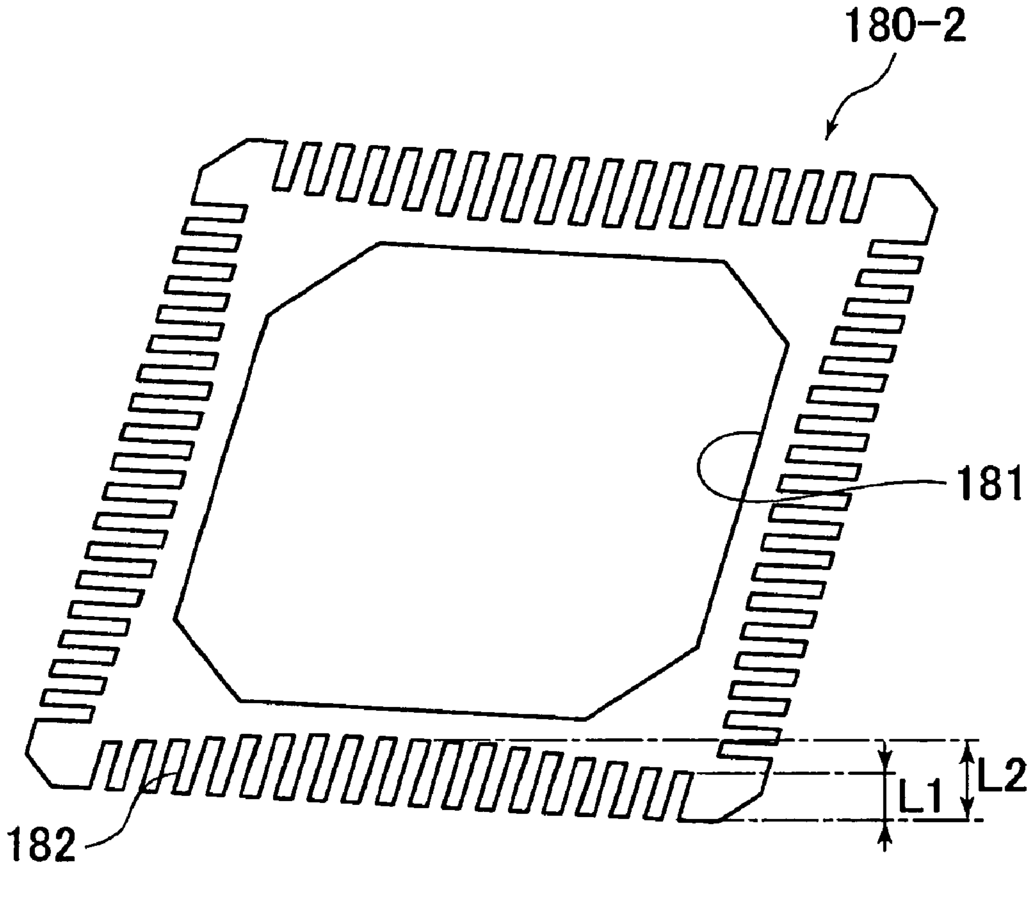
FIG. 11 illustrates an adhesive sheet in a seventh embodiment of the present invention.

FIG. 11 illustrates an adhesive sheet 180_2 in the seventh embodiment of the present invention.

The adhesive sheet 180_2 of the present embodiment is formed such that the length L1 of the cut-out 182 of a corner portion is less than the length L2 of the cut-out 182 of a middle side portion. Since, in the adhesive sheet 180_2 of the present embodiment, the contact area between the adhesive sheet 180_2 and the spacer 170 is larger in corner portions where spacer 170 is more susceptible to peeling off, it is possible to avoid the squeeze-out of the thermosetting adhesive material while maintaining the bonding accuracy of the spacer 170.

So far, the description of the seventh embodiment of the present invention has been completed, and an eighth embodiment thereof will be described. Since the eighth embodiment of the present invention has a similar structure as the sixth embodiment of the present invention excepting the shape of the cut-out of the adhesive sheet, only the differences from the sixth embodiment will be described.

Figure 12:
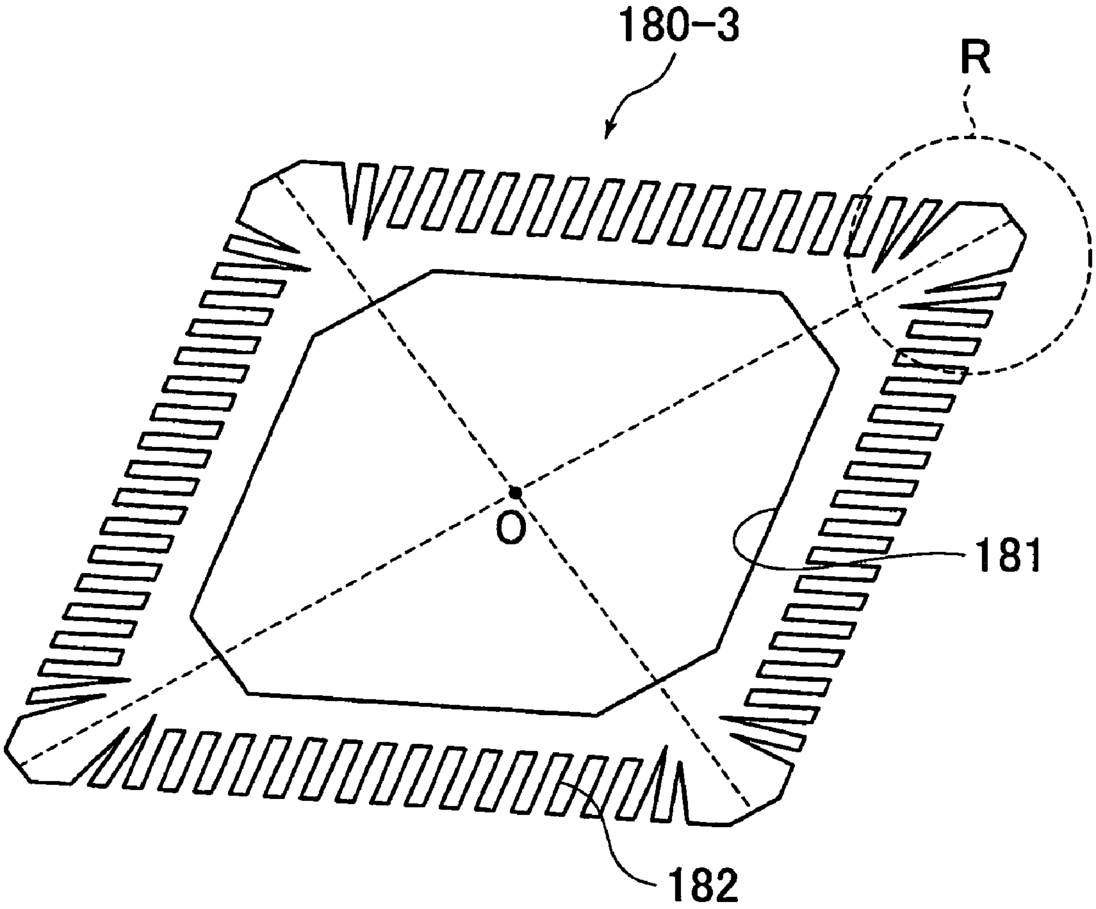
FIG. 12 illustrates an adhesive sheet in an eighth embodiment of the present invention.

FIG. 12 illustrates an adhesive sheet 180_3 in the eighth embodiment of the present invention.

Since the adhesive sheet 180_3 of the present embodiment is formed such that the cut-outs 182 in a corner portion are radially provided at an angle with one another so as to intersect within the opening 181, the contact area between the adhesive shut 180-3 and the space 170 becomes larger closer to the outer peripheral side where peeling off is more likely to take place. Thus, by providing radial cut-outs 182 in the corner portions P of the adhesive sheet 180_3, it is also possible to prevent the squeeze-out of the thermosetting adhesive material while maintaining the bonding accuracy of the spacer 170.

So far, the description of the eighth embodiment of the present invention has been completed, and a ninth embodiment thereof will be described. Since the ninth embodiment of the present invention has a similar structure as the sixth embodiment excepting the shape of the spacer, only the differences from the sixth embodiment will be described.

FIG. 13 illustrates a semiconductor component 300 which is the ninth embodiment of the present invention.

Figure 13A:
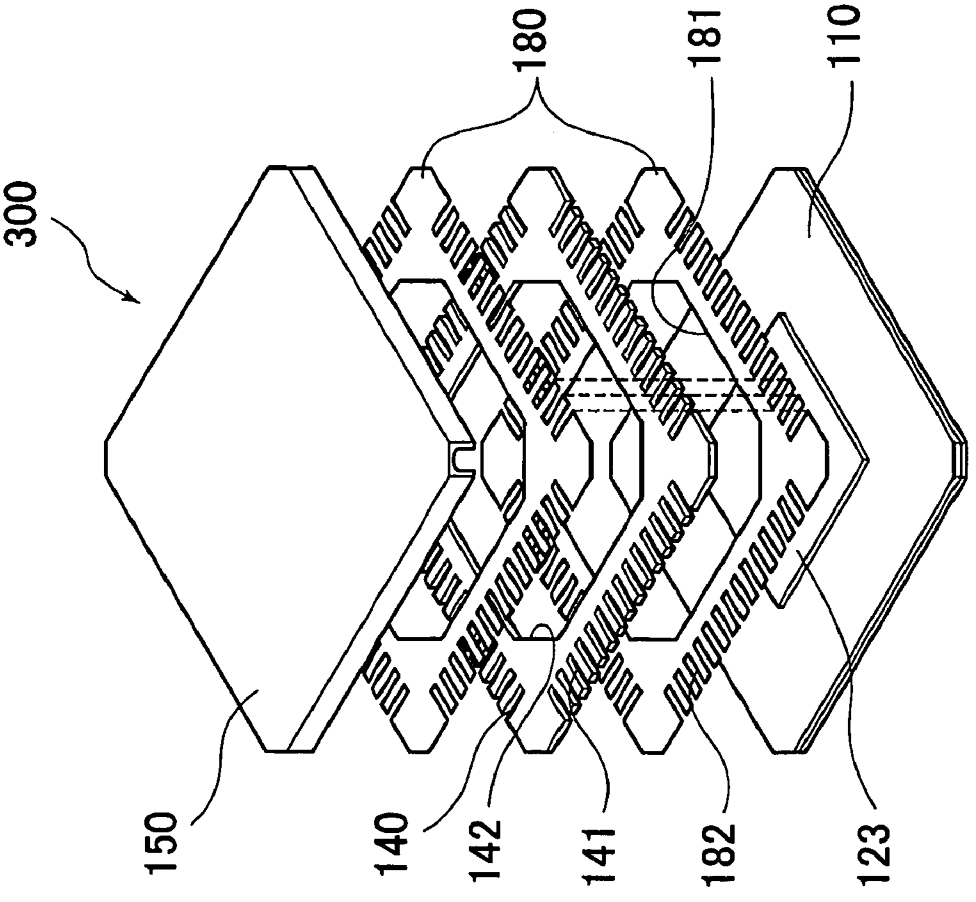
FIG. 13A illustrates an exploded perspective view of the semiconductor component.

FIG. 13A illustrates an exploded perspective view of the semiconductor component 300 of the present embodiment.

Similarly to the semiconductor component 200 of the sixth embodiment illustrated in FIG. 10, the semiconductor component 300 of the present embodiment is formed such that cut-outs 182 are formed in an adhesive sheet 180, and further cut-outs 142 are also formed in a spacer 140. Moreover, two adhesive sheets 180 and spacer 140 are placed on top of one another with the respective cut-outs 182 and 142 being lined up.

Figure 13B:
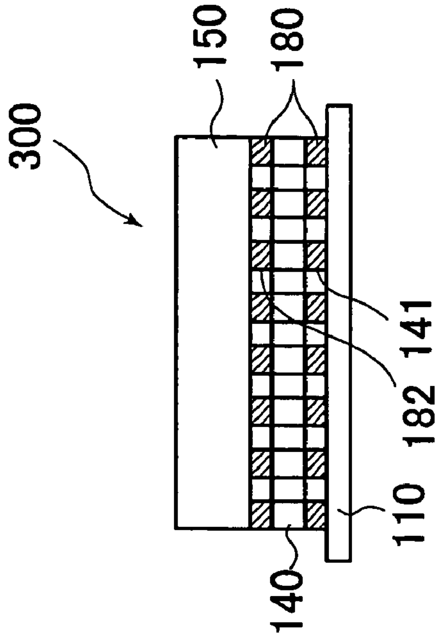
FIG. 13B illustrates a sectional view of an outer peripheral section of the semiconductor component.

FIG. 13B illustrates a sectional view of the outer peripheral section of the semiconductor component 300.

When the adhesive sheet 180 illustrated in FIG. 13B is melt, an excess thermosetting adhesive material, which has been left without been used for the bonding of the spacer 170 with the heat spreader 150 and the wiring board 110, may spread over the portion of the cut-outs 182 of the adhesive sheet 180, and also may be pushed out into the cut-outs 142 of the spacer 170. For this reason, even when the adhesive sheet 180 has a larger thickness, it is possible to securely avoid the squeeze-out of the thermosetting adhesive material.

Here it is noted that although description has been made on the cases in which grooves are provided in both the upper and lower faces of the spacer, the support member according to the present invention may be one in which grooves are provided only in one face.

Further, although, in the above, description has been made on a case in which cut-outs are provided in each of the spacer and the adhesive sheet, the support member and the adhesive member according to the present invention may be formed such that cut-outs are provided in one of the members and grooves are provided in the other.

Although description has been made on the case in which grooves are provided only in the outer peripheral section of the spacer, the support member according to the present invention may be formed such that grooves are provided in the entire upper face.

As so far described, according to the present invention, it is possible to provide a semiconductor component in which the deficiencies due to the squeeze-out of the adhesive member are mitigated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A semiconductor component, comprising:

a semiconductor element that includes a plurality of input and output signal terminals;

a wiring board that is disposed below the semiconductor element and that draws signal lines of the plurality of input and output signal terminals of the semiconductor element to the outside;

a heat conduction member that dissipates heat generated by the semiconductor element;

a joining member that is disposed between the semiconductor element and the heat conduction member and that joins the heat conduction member to the semiconductor element;

a support member that is formed with an opening so as to surround the semiconductor element, is provided with a plurality of cut-outs, and supports the heat conduction member;

a first adhesive member that is disposed between the support member and the wiring board to bond the support member with the wiring board; and a second adhesive member that is disposed between the support member and the heat conduction member to bond the support member with the heat conduction member, wherein the plurality of cut-outs reach a side section of an outer peripheral section of the support member.

2. The semiconductor component according to claim 1, wherein the cut-outs are cut-outs having a predetermined length, the cut-outs being formed in a predetermined range of the outer peripheral section of the support member to extend from an outer periphery side toward an inner periphery side so as not to intersect with one another.

3. The semiconductor component according to claim 2, wherein a plurality of cut-outs in a corner portion of the outer peripheral section of the support member are formed so as to extend from the outer peripheral side toward the inner peripheral side without intersecting with one another, and with the respective lengths of the cut-outs being reduced in stages toward the corner portion.

4. The semiconductor component according to claim 2, wherein the plurality of cut-outs in the corner portion of the outer peripheral section of the support member are formed so as to extend from the outer peripheral side toward the inner peripheral side at an angle with one another in such a way that the extensions thereof intersect at one point within the opening.

5. A method of manufacturing a semiconductor component including a wiring board, a semiconductor element disposed on the wiring board, a heat conduction member that dissipates heat generated by the semiconductor element, a joining member that is disposed between the semiconductor element and the heat conduction member and that joins the heat conduction member to the semiconductor element, a support member that is formed so as to surround the semiconductor element, the support member including a plurality of cut-outs having a predetermined length and formed in a predetermined range of each side section in the support member so as to extend starting from an outer peripheral toward an inner peripheral side without intersecting with one another, and the support member adapted to support the heat conduction member, the method comprising:

disposing the semiconductor element and the joining member on top of one another at the top of the wiring board, and disposing a first thermosetting adhesive member, the support member, and a second thermosetting adhesive member on top of one another so as to surround the semiconductor element, at the top of the wiring board;

disposing the heat conduction member on top of the joining member and the second thermosetting adhesive member;

melting the joining member, and melting the first and second thermosetting adhesive members thereby filling the plurality of cut-outs included in the support member with the thermosetting adhesive members; and hardening the thermosetting adhesive members that have been filled in the plurality of cut-outs included in the support member.

6. The semiconductor component according to claim 1, wherein the plurality of cut-outs do not reach an inner peripheral of the support member.

7. The semiconductor component according to claim 1, wherein the plurality of cut-outs are arranged near a center of the side section.

8. The method according to claim 5, wherein the plurality of cut-outs do not reach an inner peripheral of the support member.

9. The method according to claim 5, wherein the plurality of cut-outs are arranged near a center of the side section.

* * * * *